United States Patent
Thullier et al.

(10) Patent No.: US 8,591,053 B2
(45) Date of Patent: Nov. 26, 2013

(54) LIGHT SOURCE SUPPORT OF LIGHTING MODULE

(75) Inventors: Christophe Thullier, Montigny le Bretonneux (FR); Jean-Marc Nicolai, Courbevoie (FR)

(73) Assignee: Valeo Vision, Bobigny (FR)

( * ) Notice: Subject to any disclaimer, the term of this patent is extended or adjusted under 35 U.S.C. 154(b) by 376 days.

(21) Appl. No.: 12/894,331

(22) Filed: Sep. 30, 2010

(65) Prior Publication Data

US 2011/0103081 A1    May 5, 2011

(30) Foreign Application Priority Data

Sep. 30, 2009  (FR) ...................... 09 56783

(51) Int. Cl.
*F21V 21/00* (2006.01)
*F21V 21/34* (2006.01)

(52) U.S. Cl.
CPC ..................... *F21V 21/34* (2013.01)
USPC ........................... 362/97.2; 362/84

(58) Field of Classification Search
USPC ............... 362/396, 249.02, 249.01, 249.04, 362/249.08, 362
See application file for complete search history.

(56) References Cited

U.S. PATENT DOCUMENTS

| | | | |
|---|---|---|---|
| 6,294,255 B1 | 9/2001 | Suzuki et al. | |
| 7,290,913 B2 | 11/2007 | Watanabe et al. | |
| 7,535,727 B2 | 5/2009 | Tokida | |
| 7,997,758 B2 * | 8/2011 | Zhang et al. | 362/235 |
| 8,052,303 B2 * | 11/2011 | Lo et al. | 362/249.05 |
| 8,109,652 B2 * | 2/2012 | Chen | 362/249.02 |
| 2006/0044840 A1 | 3/2006 | Watanabe et al. | |
| 2007/0171662 A1 | 7/2007 | Tokida | |
| 2009/0096341 A1 | 4/2009 | Dobler et al. | |
| 2010/0018048 A1 | 1/2010 | Sakai et al. | |

FOREIGN PATENT DOCUMENTS

| | | |
|---|---|---|
| DE | 102007049310 A1 | 4/2009 |
| EP | 1630474 A2 | 3/2006 |
| EP | 1675223 A1 | 6/2006 |
| FR | 2922167 A1 | 4/2009 |
| WO | 2008081969 A1 | 7/2008 |

* cited by examiner

*Primary Examiner* — Sharon Payne
(74) *Attorney, Agent, or Firm* — Jacox, Meckstroth & Jenkins (57) ABSTRACT

A light source support on a first printed circuit for a lighting and/or signalling module, comprising
a first housing intended to accommodate the first printed circuit and presenting an opening for the light source;
means of positioning and fixation of the support;
and means of positioning of a flexible printed circuit, intended to position the flexible printed circuit in relation to the first printed circuit, so as to link them electrically.

26 Claims, 7 Drawing Sheets

LIGHT SOURCE SUPPORT OF LIGHTING MODULE

CROSS-REFERENCE TO RELATED APPLICATIONS

This application claims priority to French Application No. 0956783 filed Sep. 30, 2009, which application is incorporated herein by reference and made a part hereof.

BACKGROUND OF THE INVENTION

1. Field of the Invention

The invention concerns a light source support for a lighting or signaling module. In particular, the invention concerns a light source support fitted on a first printed circuit, and more particularly for a light source of the electroluminescent type of a lighting device requiring a certain lighting power.

2. Description of the Related Art

Light sources with an electroluminescent diode, still referred to as LEDs, are currently preferred to the more classical sources such as discharge lamps and halogen lamps, for various reasons. Electroluminescent diodes present a certain number of advantages. First of all, it has been known for a long time that this type of diode does not radiate in all directions, but radiates in a semi-space opposite a substrate which supports the photo-emissive elements of the electroluminescent diode; thus, by using a more directed radiation, the quantity of energy lost is less important than with discharge lamps or halogen lamps. Then, these diodes were recently perfected in terms of radiated power. Finally, LEDs consume less energy, even at equal radiated power, whether they are discharge lamps or halogen lamps; they are not cumbersome, and their particular shape offers new possibilities for the realization and arrangement of the complex surfaces associated with them, particularly by arranging them on electronic supports of flexible electronic support type. A certain number of constraints linked to heat dissipation is, however, still important for LEDs of power. The expression "LED of power", designates an electroluminescent diode, the light flow of which is in the order of at least 30 lumens. In order to cool electronic components, and particularly power diodes, it is known to fit the component for cooling on a radiator. The natural convection that takes place with the radiator provides cooling. Consequently, one uses a radiator large enough to cool the component satisfactorily.

A light source of electroluminescent type is often formed by applying semi-conductor layers on a substrate or directly on a printed circuit which is then at the same time substrate and printed circuit on which the LED is fixed. This type of realization of light source with electroluminescent diode is particularly used for light sources of power, such as those found in lighting devices, particularly motor vehicle headlights.

It must be possible to accurately position the light source of a lighting or signaling device, which must be connected to an electricity supply and be cooled. In order to do this, there must be an adequate support.

The document EP 1 630 474 A2, which is equivalent to U.S. Pat. No. 7,290,913, divulges a LED support on a substrate for a vehicle lighting device. The substrate comprises the electrodes that switch on the photo-emissive element of the LED. The support provides an approximate positioning of the light source in relation to the support itself, as well as an electrical connection between the electrodes of the substrate and a connector integrated within the support. The electrical connection is provided by elastic contacts under pressure with the corresponding contacts on the top side of the substrate. Heat dissipation is assured by an opening of the support which frees the lower side of the substrate so as to be able to place it on a heat dissipation radiator.

The support of this teaching, however, presents a few disadvantages. In effect, it does not allow exact positioning, but a floating positioning of the light source. The operation of fitting the support of the light source to the module or lighting device therefore requires accurate handling in order to ensure the optical and photometric qualities of the module or lighting device. Furthermore, the connector integrated within the support may make it difficult to operate the connection of the light source to the electricity supply module. In effect, the lighting devices are often of reduced accessibility, particularly at the level of the location where the light sources are positioned.

The document FR 2 922 167 A1, which is equivalent to U.S. Patent Publication No. 2009/0096341, divulges an example of realization of a principle of fitting a LED on a lighting module. The LED comprises four photo-emissive elements arranged on a printed circuit which is itself fixed to a support. The support is arranged on a heat dissipater by means of a fixation device comprising two strips which are each supported at the bottom of a hollowing made on two opposite edges of the support. This device is, however, more complicated, and in the case of reduced accessibility, the connection operation remains difficult.

What is needed, therefore, is a system and method for providing an improved support for supporting a light source that overcomes one or more of the disadvantages noted above.

SUMMARY OF THE INVENTION

The aim of the invention is to offer a light source support that allows a more simple integration within an optical module for a motor vehicle.

One object of the invention is a light source support fixed on a first printed circuit for a lighting and/or signaling module, with the support comprising the following:
 a first housing intended to accommodate the first printed circuit and presenting an opening for the light source;
 means of positioning and fixation of the support in relation to the lighting module;
 means of positioning of a second printed circuit which is a flexible printed circuit; these means of positioning are intended to position the flexible printed circuit in relation to the first printed circuit in order to allow an electrical connection between the flexible printed circuit and the first printed circuit.

The support according to one embodiment of the invention assures a positioning between a flexible printed circuit and the support, and thus makes it possible to establish a reliable rigid electrical connection before assembly (typically in the factory) between the conductors of the flexible printed circuit and the conductors of the first printed circuit. The support may therefore be fitted with a section of the flexible printed circuit while guaranteeing the mechanical and electrical connection between the two. This gives great freedom of orientation of assembly in order to ensure the flexibility of the flexible printed circuit. In the case of the teaching of document EP 1 630 474 A2, which is equivalent to U.S. Pat. No. 7,290,913, the support, due to the integration of the connector, does not allow the freedom of orientation that allows the support of the invention. One embodiment of the present invention likewise makes it possible to directly fix the support of the first printed circuit to a thermal dissipater. A flexible printed circuit, in the present application, is a printed circuit of which the insulating material of the conductor paths is made in a flexible polymer. This type of printed circuit a typically in the shape of a ribbon and is also known by the professional under the name of 'Flexboard' (as opposed to the rigid plate supporting the conductor paths in the other printed circuits). The advantage of these circuits is that one may give orientations at its ends that vary in relation to each other. One may also give it different configurations by bending it in different directions.

According to one advantageous mode of the invention, means of positioning comprise at least one element, preferably a pin, intended to cooperate with a corresponding opening applied in the flexible printed circuit.

Typically, the flexible printed circuit presents two holes positioned on two pins, these pins being then widened by heading in order to ensure a permanent mechanical connection. This simple and cheap connection is sufficient to ensure the positioning and maintenance of the flexible printed circuit in relation to the support. In practice, the electrical connection is then not under stress when handling the unit consisting of the support, light source and flexible printed circuit.

According to one advantageous mode of the invention, the light source support according to the invention comprises a second housing intended to accommodate the flexible printed circuit, this first housing and this second housing being arranged in relation to each other in such a way as to position the flexible printed circuit on the first printed circuit, preferably close to one of the edges of the first printed circuit. This arrangement of the support allows an easy electrical connection between the flexible printed circuit and the first printed circuit. For example, the second housing may be in the extension of the first housing so as to position the flexible printed circuit on the first printed circuit, close to one of the edges of the first printed circuit.

According to one advantageous mode of the invention, the second housing presents an opening close to the opening of the first housing.

The opening of the second housing gives access to the flexible flat printed circuit in order to carry out a welding operation between the superimposed flexible printed circuit and the first printed circuit.

According to one advantageous mode of the invention, the means of positioning of the flexible printed circuit comprise means of guiding intended to operate on the longitudinal edges of the flexible printed circuit.

These means of guiding, typically two opposite longitudinal edges, allow a satisfactory alignment of the flexible printed circuit in relation to the support and the first printed circuit.

According to one advantageous mode of the invention, the first housing comprises edges formed by recess in the thickness of the support; these edges at least partially surround the opening of the first housing. This allows the first printed circuit to be set up by a simple movement consisting of laying the first printed circuit on its housing. Preferably, the edges completely surround the opening of the first housing, thus making it easier to position the first printed circuit. According to one variant of realization, the support is an essentially flat element with a thickness, the first housing comprising the edges formed by the recess in the thickness of the support.

According to one advantageous mode of the invention, the support comprises a second housing intended to accommodate the flexible printed circuit and comprising edges formed by a recess in the thickness of the support in the extension of the recess of the first housing.

This arrangement allows an alignment of the first printed circuit and the flexible printed circuit by means of simple and common measurements. This results in a simplified and hence cheaper design of the support.

According to one advantageous mode of the invention, the edges of the second housing present an outward opening for the access of the flexible printed circuit to the support; the edges comprise a corner part on both sides of the opening, thus forming a retention of the flexible printed circuit towards the outside of the support.

The corner part allows the flexible printed circuit to be secured according to a longitudinal axis, and therefore a precise axial positioning.

According to one advantageous mode of the invention, the edges of the first and/or second housing comprise means of maintaining the first printed circuit on the support. According to one mode of realization, these means of maintenance are deformable excrescences used for a precise positioning and/or means of clipping such as the resilient hooks used to retain the first printed circuit.

The excrescences, typically with points or corners, enable a snug fitting of the first printed circuit, while allowing a certain tolerance of manufacture at the level of the dimensions of the first printed circuit and the edges of the support. They make it possible, for example, to fix the first printed circuit by putting it securely into the housing. They are then deformed and therefore give a strong hold on the first printed circuit.

One embodiment of the invention comprises a light source device comprising a support as described above, a light source fitted on a first printed circuit, the first printed circuit being housed in the support, and a flexible printed circuit linked to the support, preferably mechanically and electrically.

According to one advantageous mode of the invention, the flexible printed circuit is linked mechanically to the support by at least one pin of the support, cooperating by insertion with a corresponding opening of the flexible printed circuit, the end of the pin being widened, preferably by heading, after insertion into the opening.

According to one advantageous mode of the invention, the end of the flexible printed circuit on the side of the support is superimposed on the first printed circuit, and linked electrically to the first printed circuit by laser welding or a hot welding of 'Hot Bar' type.

According to one advantageous mode of the invention, the end of the flexible printed circuit on the side of the support is arranged alongside the first printed circuit and linked electrically to the first printed circuit by wire welding.

According to one advantageous mode of the invention, the device comprises a connector to the end of the flexible printed circuit, opposite the support.

One embodiment of the invention further comprises a lighting or signaling module comprising a support as described above or a light source device as described above. According to one advantageous mode of the invention, the light source device is fixed on a cooler, for example a thermal dissipater, preferably a radiator with fins.

Other characteristics and advantages of the present invention will be better understood with the aid of the description and drawings comprising the following:

DETAILED DESCRIPTION OF THE PREFERRED EMBODIMENTS

A description of various embodiments of the invention set out below comprises terms of orientation such as, for example, 'upper' and 'lower' of certain elements or certain parts of the support and of the devices illustrated in the figures of the request. These terms are to be interpreted in a way that is relative in relation to the representations of figures and not in an absolute way. The support described and the light source device comprising the support may actually be set up in a lighting module in different positions and orientations.

Support 2 illustrated in FIGS. 1 to 5 and 7 to 8, corresponds to a first mode of realization of the invention. FIGS. 1 to 4 and 7 to 8 represent the support 2 seen from the side intended to be fixed against an element of a lighting module. It comprises a flat element with a certain relatively constant thickness. It is a part in electrically insulating material, preferably injected plastic material of PBT or PBTP type, which is the abbreviation of Polybutylene Terephthalate or Butylene Polyterephthalate, designating a plastic material of Polyester type. The material must likewise resist the temperatures imposed by the heat released by the light source, typically in the order of 12° C.

Figure 6:
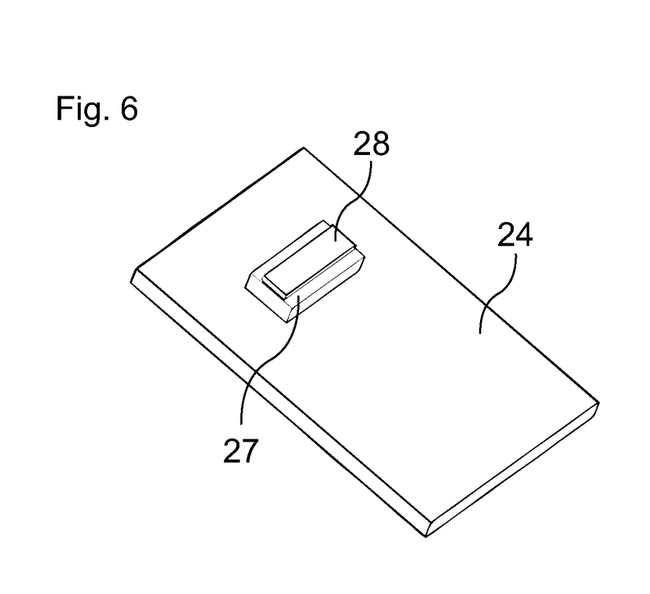
FIG. 6 is a perspective view of the first printed circuit with the electroluminescent diode.

This support 2 is intended to maintain a first printed circuit 24 on which a LED is fixed. Such a printed circuit 24 comprising a LED is illustrated in FIG. 6. The LED comprises a photo-emissive element 28 which emits light when it is connected. This photo-emissive element 28 is fitted onto a substrate 27 which carries the electrodes which supply this photo-emissive element. Substrate 27 is fixed on a side of the first printed circuit 24. The electrodes (not represented) are connected to the paths of this first printed circuit 24. The substrate 27 is electrically insulating and a heat conductor in order to allow the transfer of heat towards a heat conducting element, which in the example illustrated opens onto the other side of the first printed circuit 24. In certain variants of realization (not represented), the substrate 27 and the first printed circuit 24 may constitute one and the same part. The support according to the present invention is still adapted to these variants of realization.

The support comprises two pins 4 of positioning in relation to a lighting module as well as two fixation eyelets 6. It also comprises a cavity formed by a rectangular hollowing. This hollowing comprises U-shaped edges 13 (FIG. 2), intended to accommodate edges of the first printed circuit 24 of the light source. The edges 13 form a first housing reserved to the light source. An opening 10 is made in the first housing in order to ensure access to both sides of the first printed circuit 24. Excrescences, outgrowths or projections 14, which are pointed or rounded, are arranged along the edges 13 in order to make contact with the outer edges of the first printed circuit 24 and ensure precise positioning, while allowing a certain tolerance at the level of the exterior dimensions of the first printed circuit 24 and the first housing. When the first printed circuit 24 is driven into the first housing, these excrescences 14 become deformed in a direction essentially parallel to the level of the first printed circuit 24 in the direction of edges 13 of the first housing. Due to their elasticity, they then exercise a force of maintenance in the opposite direction to their deformation and thus ensure that the first printed circuit 24 remains within the first housing of the support 2.

Figure 1:
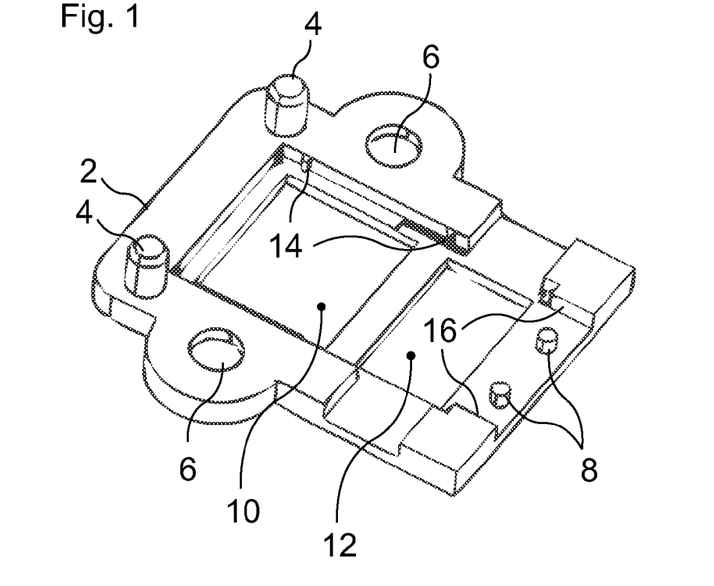
FIG. 1 is a perspective view of the support according to a first mode of realization of the invention.
Figure 2:
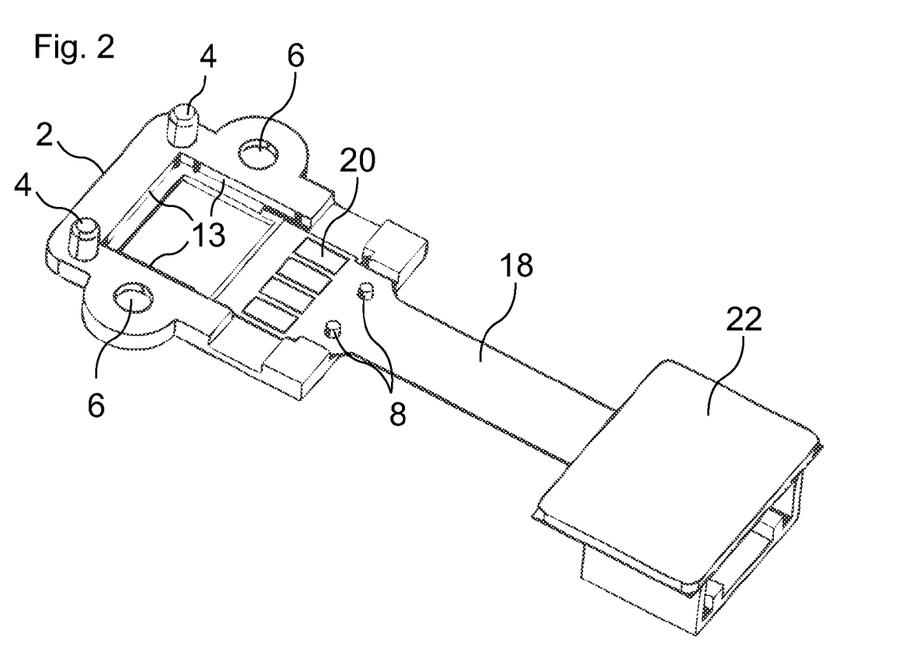
FIG. 2 is a perspective view of the support of FIG. 1 with a flexible printed circuit of supply with its connector.

A second housing is formed in support 2 by the continuity of edges 13, that is, on FIGS. 1 and 2 to the right of support 2. This second housing is also prolonged by edges 16. This second housing likewise presents an opening 12 intended to allow access to a flexible printed circuit 18 to be housed and fixed in the second housing.

As illustrated in FIG. 2, a flexible printed circuit 18 or even a 'flexboard' or 'flexible printed circuit' is used to make the electrical connection between the light source and connector 22. The flexible printed circuit 18 of FIG. 2 comprises four electrical paths (not represented) which run along the flexible printed circuit 18 and are linked electrically to the connector 22. Two paths serve to supply the light source with electrical energy, and the other two paths serve to be linked to a thermistor of type CTN (negative temperature coefficient), the resistance of which decreases in proportion to the temperature. The thermistor (not represented) makes it possible to check the prevailing temperature at the level of substrate 27 (FIG. 6) close to light source 28. It should be noted that the presence of means of temperature monitoring is not obligatory. The paths terminate on the support side, each by a surface of contact 20 (FIG. 2) intended to make contact with a corresponding contact surface of the first printed circuit 24. The support side end of the flexible printed circuit 18 presents a widened shape in order to join edges 16 and 13 of the support 2. This part of the flexible printed circuit 18 presents two orifices, each crossed by a pin 8. This arrangement results in a precise positioning of the flexible printed circuit 18, particularly of contact surfaces 20 in relation to the support 3.

Figure 3:
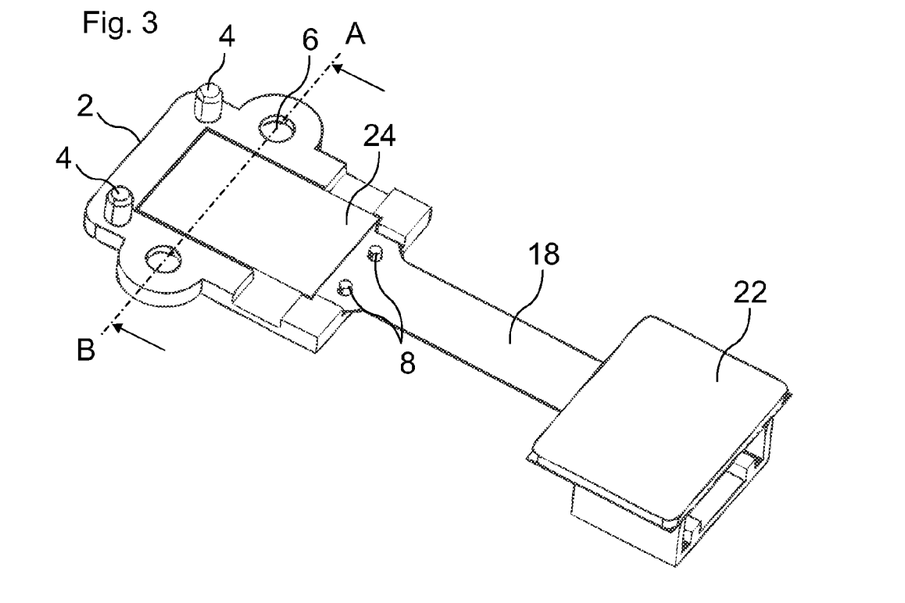
FIG. 3 is a perspective view of a light source device according to the present invention comprising the support, with a similar flexible printed circuit in FIG. 2 as well as the light source (not visible) fixed on the first printed circuit.

FIG. 3 illustrates the support of FIG. 2 where the first printed circuit 24 with the light source (not represented in this figure as it is on the other side of the side of the first printed circuit which is visible on this figure) is set within its housing. The housing in question consists of the U-shaped housing and the housing of the flexible printed circuit 18. Part of the first printed circuit 24 covers the flexible printed circuit 18 so as to place its electrical contacts (not represented) opposite the electrical contacts 20 of the flexible printed circuit 18.

Opening 12 of the second housing gives access for the welding of contacts 20 of the flexible printed circuit 18 with the corresponding contacts of the first printed circuit 24. The welding operation may be of laser type or a hot welding of 'Hot Bar' type. Hot Bar welding is a procedure that makes it possible to weld two printed circuits (mainly a flexible printed circuit on a rigid circuit) with the aid of a thermode. During the welding operation, a thermode is applied on the parts with a previously determined pressure, which makes it possible to correctly maintain the flexible printed circuit during the operation and obtain a satisfactory contact during the simultaneous welding of all the clips of the flexible printed circuit onto the slots of the first printed circuit. The weld phase features a temperature profile in stages, broken down into three sequences: assembly time, maintenance slot and cooling time. This process allows the creation of a permanent electromechanical connection between the parts.

Other methods of welding or brazing known by the professional may be envisaged.

Figure 4:
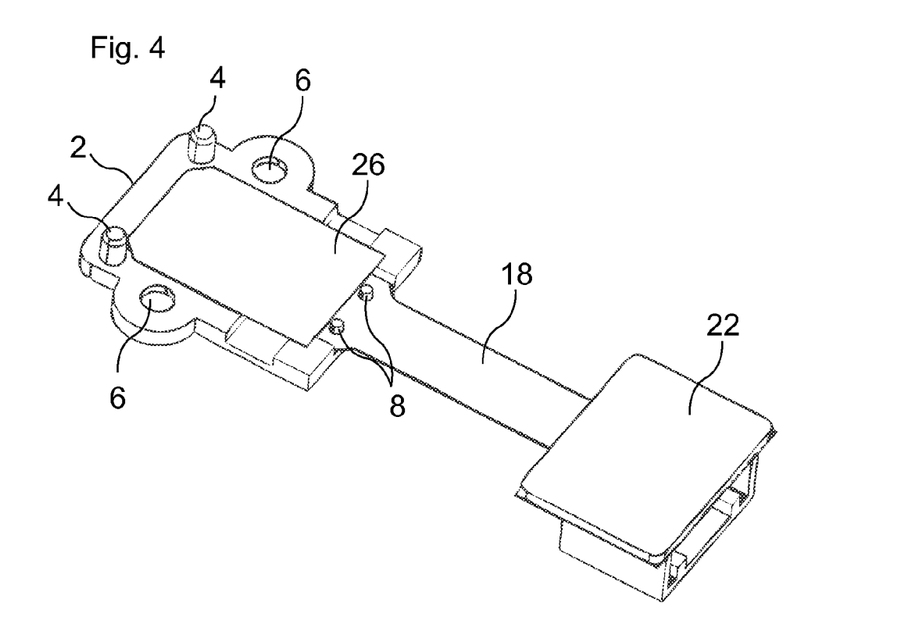
FIG. 4 is a perspective view of the support with a section of flexible printed circuit and the first similar printed circuit in FIG. 3 with, furthermore, a thermal interface on the back of the first printed circuit.

A thermal interface 26, as illustrated in FIG. 4, is arranged on the side of the first printed circuit 24 opposite the side that holds the LED. This interface 26 serves to ensure good heat conduction between the first printed circuit 24 and the radiator or heat diffuser (not represented in this FIG. 4) upon which the support 2 is fixed and the thermal interface 26 is applied.

Figure 5:
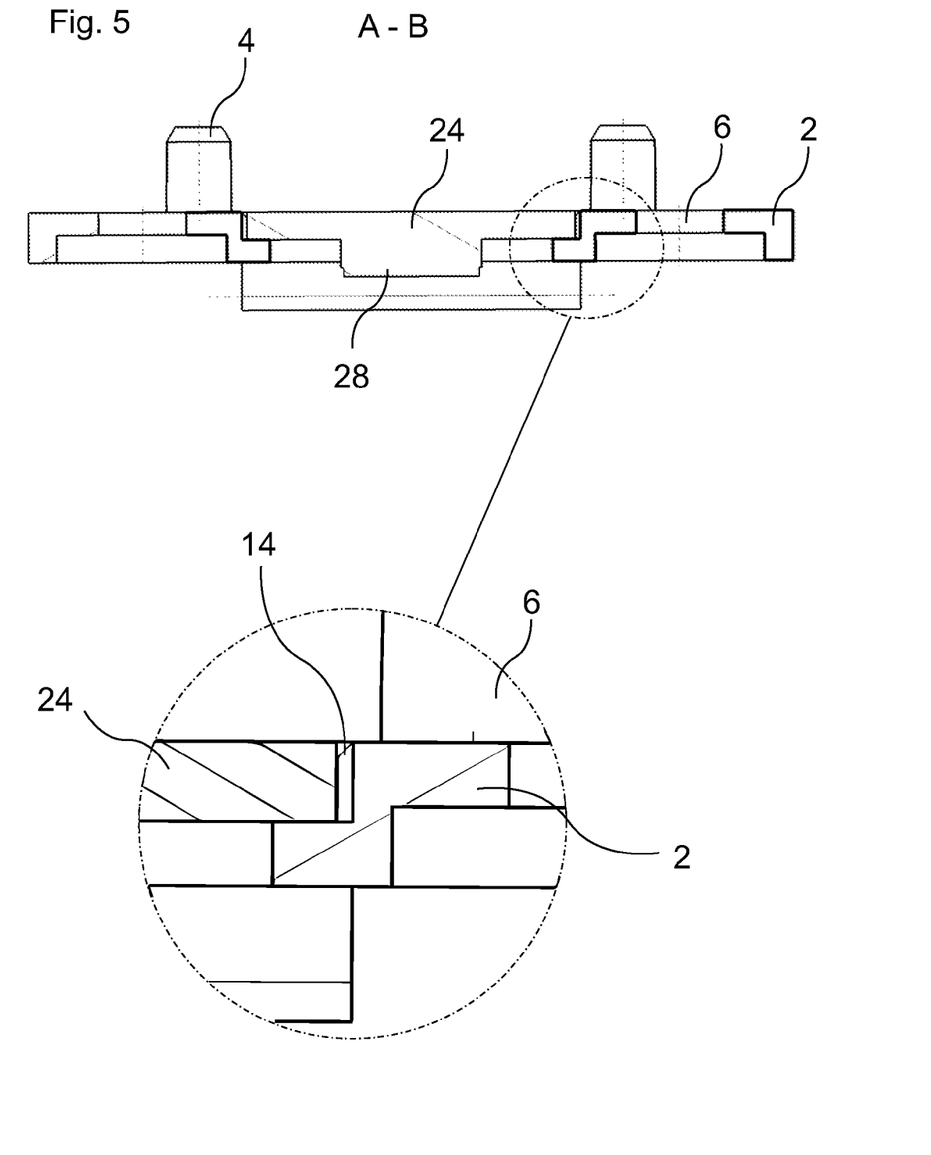
FIG. 5 is a section view according to the axis A-B of the support equipped with the first printed circuit and the light source as illustrated in FIG. 3.

FIG. 5 is a section view according to axis A-B in FIG. 3 of support 2, equipped with the first printed circuit 24 and light source 28. One may observe here the section in steps of the edges of the support 2 forming the housing of the first printed circuit 24. The enlarged view of the section in steps, surrounded with dots on FIG. 5, illustrates one of the pointed excrescences 14 present on the edge of the housing. It is generally of triangular or semi-cylindrical section, and is generally directed perpendicular to the level of the housing and/or support. It presents a beveled end on the outside of the housing intended to facilitate the centering and insertion of the first printed circuit 24 in the housing. Advantageously, the outer surface (in relation to the housing) of the first printed circuit 24 is aligned with the corresponding surface of the support 2, so as to be able to accommodate the thermal interface 26 (FIG. 4).

Figure 7:
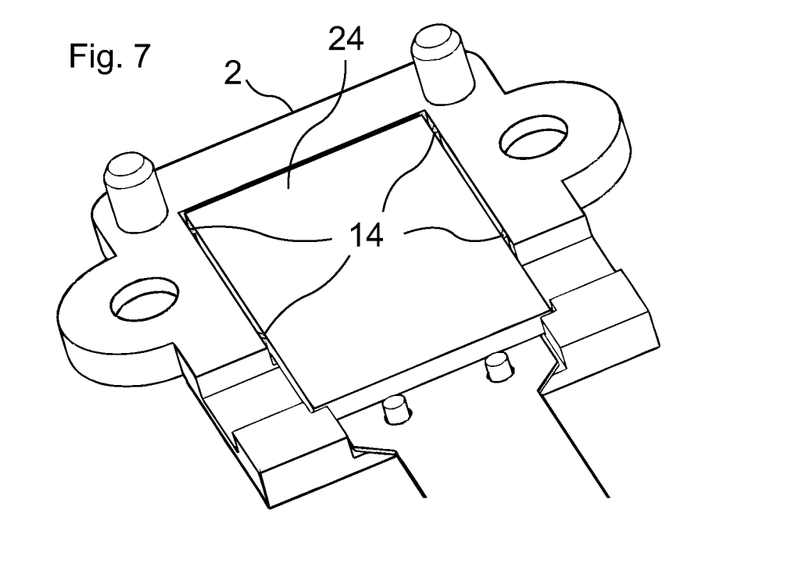
FIG. 7 is a perspective view of the first printed circuit in its housing.

FIG. 7 essentially corresponds with FIG. 3, illustrating in further detail the first printed circuit 24 housed in the support 2 and held in place by the pointed excrescences 14 along the edges of the housing.

Figure 8:
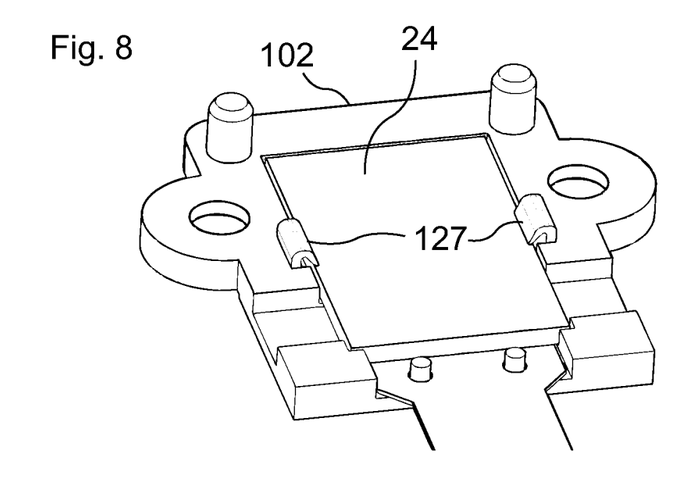
FIG. 8 is a perspective view of a support according to the previous figures, with alternative means for the retention of the first printed circuit on the support.

Alternative or complementary means to those described in relation with FIGS. 1-7 and which serve to maintain the first printed circuit in its housing, are illustrated in FIG. 8. Support 102 comprises two hooks 127 arranged on opposite edges of the housing of the first printed circuit 24. These hooks 127 are elastic and designed in such a way that their hooking edges bend at the time of setting up the first printed circuit 24, and these hooking edges resume their initial shape after insertion of the first printed circuit 24. The number of hooks 127 may be variable, provided they are arranged on opposite edges of the housing.

Figure 9:
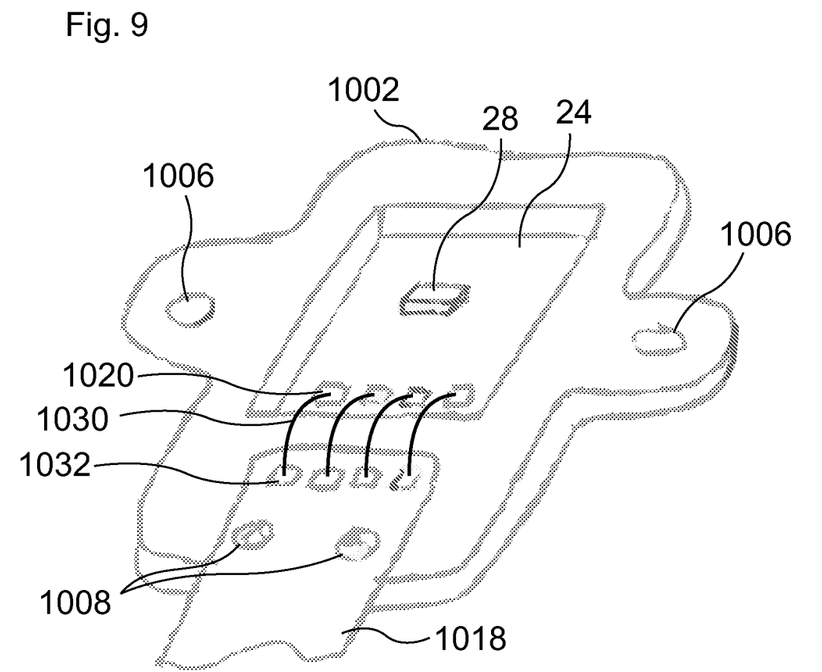
FIG. 9 is a perspective view of a support according to a second mode of realization of the invention.

A second mode of realization of the invention is illustrated in FIG. 9. Similarly to that of the first mode of realization, support 1002 is an essentially slim element in electrically insulating material, preferably in plastic injected material of PBT type. It presents two fixation and positioning eyelets 1006. As opposed to the support of the first mode of realization, the support 1002 presents a single opening or window corresponding to the opening of the first housing for the first printed circuit 24. In FIG. 9, the first printed circuit 24 is housed in a housing formed by open rectangular notches. These open notches or edges are not visible as they are located on the lower side of the support. The support 1002 presents, similarly to that of the first mode of realization, two pins 1008 arranged close to an edge of the support, particularly the edge that matches contacts 1020 of the first printed circuit 24. These pins 1008 engage with corresponding orifices of the flexible printed circuit 1018. The ends of the pins are thermoformed by heading in order to set the means of fixation by way of a rivet. Other techniques known in themselves by the professional, such as, for example, an ultrasound technique, may also be used.

The flexible printed circuit comprises four conductor paths terminating in four contact zones 1032 at the end of the flexible printed circuit on the side of the support. Connections 1030 between these four contact zones 1032 and the corresponding contact zones 1020 of the first printed circuit are assured by the technique of wire welding or again, 'wire-bonding'. Wire welding is a process of assembly of identical or different types of materials by thermo-compression at high speed and/or ultrasound welding. A micro-wire (or bandage), generally in gold or aluminum, is welded by fusion to the surface of contact ('bondpad') of the first printed circuit and to the corresponding points of contact of the flexible printed circuit.

Other electrical connection techniques suitable to link the terminations or contact zones 1032 of the flexible printed circuit 1018 to the corresponding ones 1020 of the first printed circuit 24 may be envisaged.

The support of the second mode of realization thus makes it possible, similarly to that of the first mode, to ensure precise positioning of the flexible printed circuit in relation to the support, and the application of a technique of reliable connection between the electrical terminations of the flexible printed circuit and those of the first printed circuit 24. The housing arranged in the support in order to accommodate the first printed circuit 24 is arranged on the lower side of the support in the configuration of FIG. 9, or at least on the side opposite the one intended to accommodate the flexible printed circuit. It is actually important for the rear side of the first printed circuit 1018, that is, the one opposite the light source, to be free so as to enable its contact with a heat dissipater, via the substrate and a thermal interface of the first printed circuit 24. Contrary to the first mode of realization, the flexible printed circuit 1018 is set on the side of the support corresponding to the side of the first printed circuit comprising the light source.

Means of fixation and positioning of the flexible printed circuit 1018 as a supplement or alternative to the two pins 1008 may be envisaged, such as, for example, the presence of a cavity or recess in the support so as to form edges or notches as in the support of the first mode of realization.

Figure 10:
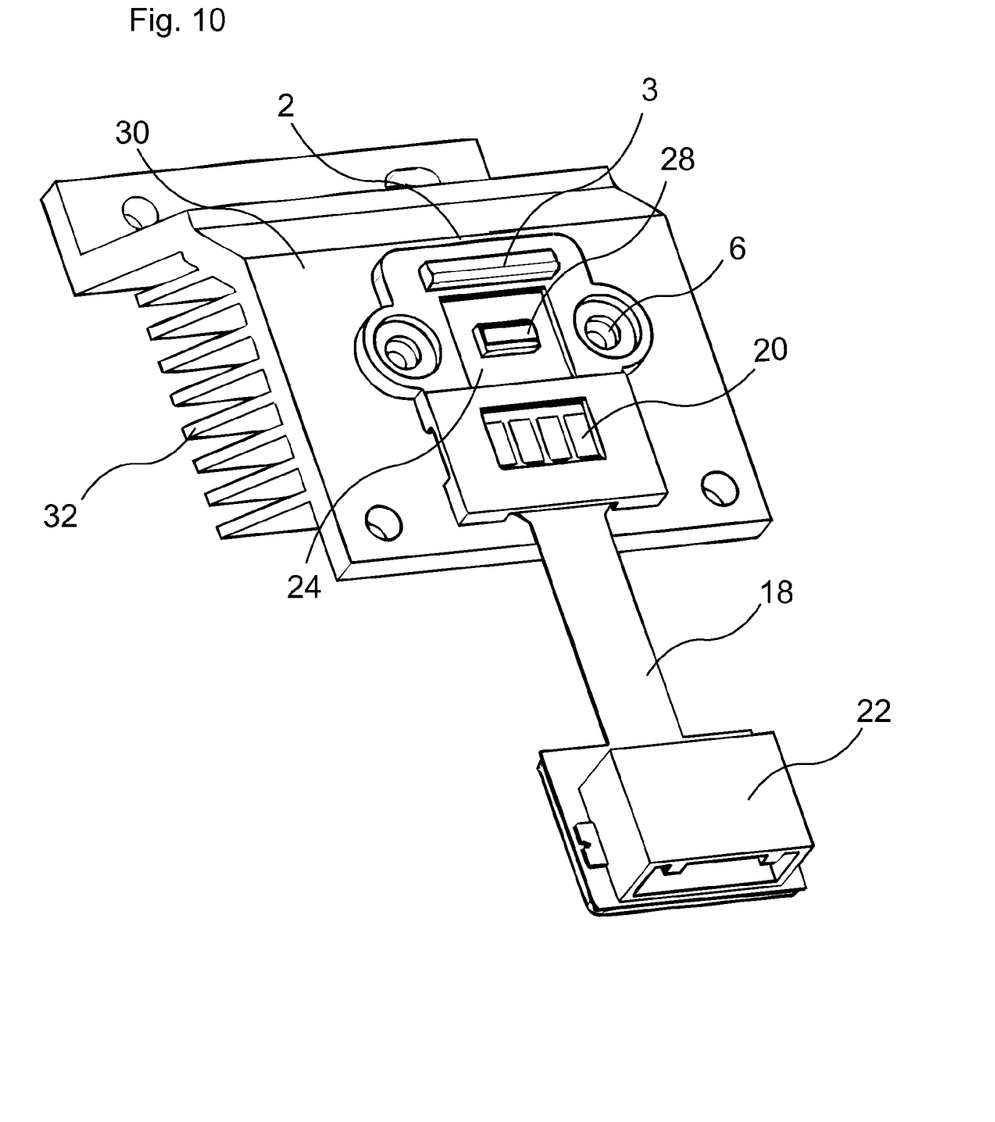
FIG. 10 is a perspective view of the complete device as illustrated in FIG. 4 and arranged on a thermal dissipater.

FIG. 10 is an illustration of the fitting of the device on a heat dissipater 30. The fixation eyelets 6 are ready to accommodate means of fixation such as screws or rivets in order to fix the support to the heat dissipater 30. The rear side of the first printed circuit 24 is in contact via a thermal interface with a corresponding surface of the heat dissipater 30, the latter comprising fins 32, which serve to disperse the heat produced by the photo-emissive element 28 of the LED.

Figure 11:
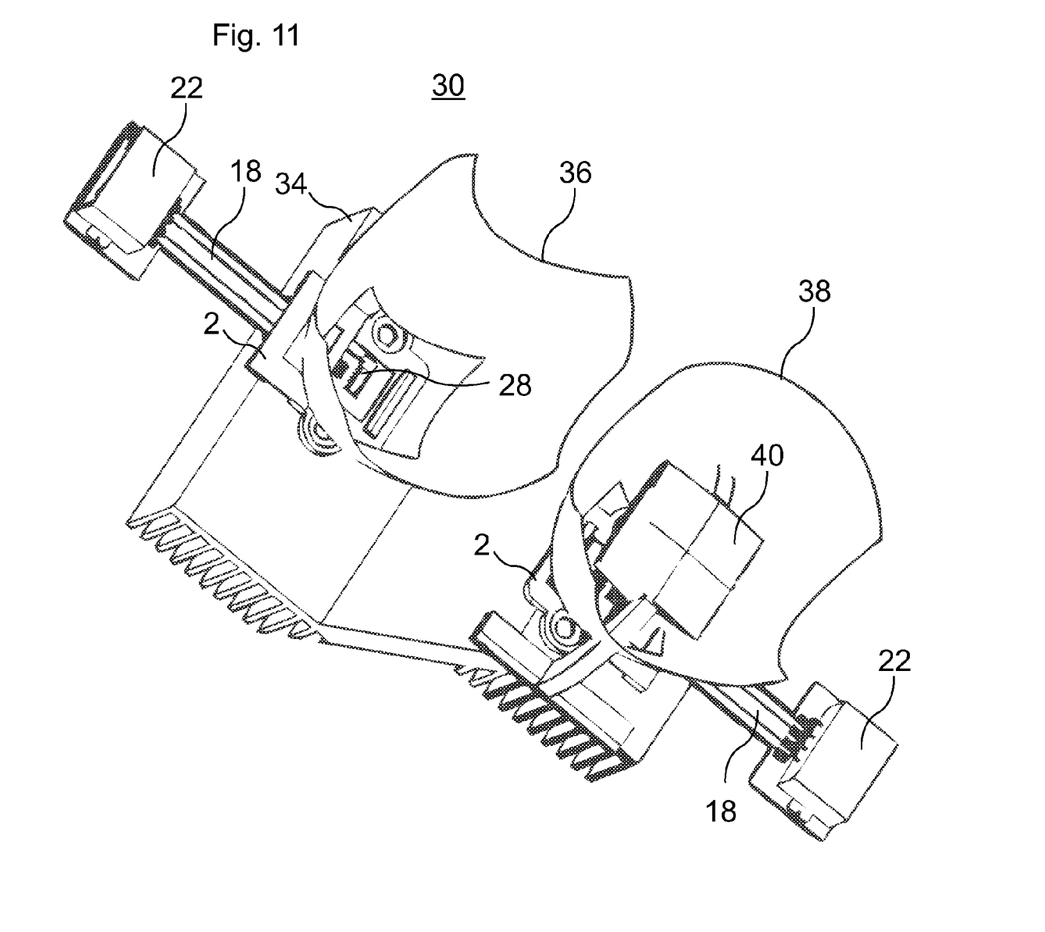
FIG. 11 is a perspective view showing two lighting modules, each comprising a support and a light source device according to the invention.

Two lighting modules, comprising a support which complies with the first mode of realization, are illustrated in FIG. 11. Lighting device 30 comprises a heat dissipater 34 common to both modules. Two assemblies which comply with that of FIGS. 4 and 5 are arranged on dissipater 34. Each assembly comprises a support 2, a light source 28 of the electroluminescent type on a first printed circuit, and a flexible printed circuit comprising a connector 22 at one end. The other end of the flexible printed circuit is mechanically linked to support 2 and electrically linked to the first printed circuit. Each module comprises a reflector 36 and 38, each having a reflecting concave surface with parabolic profile. A lens 40 is provided in the cavity of reflector 38 of the second module, in such a way that only part of the light passes across it.

The flexibility of the flexible printed circuit 18 allows great freedom of orientation of the light source support while allowing a fairly easy connection of connector 22 to the supply electronics, whatever the design and geometry of the headlight comprising the lighting modules of FIG. 11.

The supports described above may advantageously apply to lighting modules comprising several light sources. In effect, in this case, one may provide a flat cable or preferably a flexible printed circuit comprising a connector at one end, similar to connector 22 of FIGS. 2 to 4 and 10, and branching off to the other end into as many branches as there are light sources, each branch being linked to a support according to the invention. The electrical paths leading from the connector will be therefore multiplied to the level of the ramifications or, alternatively or as a supplement, some of them may be specific to certain light sources, in accordance with the lighting device intended to accommodate such an assembly and according to the lighting and/or signaling functions to be provided.

While the forms of apparatus herein described constitute preferred embodiments of this invention, it is to be understood that the invention is not limited to these precise forms of apparatus, and that changes may be made therein without departing from the scope of the invention which is defined in the appended claims.

What is claimed is:

1. A support for a light source fixed on a first printed circuit board for a lighting and/or signalling module, the support comprising:
    a first housing for receiving said first printed circuit board and presenting an opening for said light source;
    means of positioning and fixation of said support in relation to a lighting and/or signalling module; and
    means of positioning of a second printed circuit which is a flexible printed circuit to cause said flexible printed circuit to be positioned in relation to said first printed circuit board in order to allow an electrical connection between said flexible printed circuit and said first printed circuit board;
    wherein said support comprises a plurality of edges that cooperate to define an aperture in said support so that when said first printed circuit board and said second printed circuit are received on said support, said light source becomes aligned with said aperture so that light emitted from said light source projects through said aperture and said electrical connectors of said first printed circuit board either come into contact with electrical connectors of said second printed circuit or are arranged close to electrical connectors of said second printed circuit.

2. The support for a light source according to claim 1, wherein said means of positioning comprise at least one pin intended to cooperate with a corresponding opening made in said flexible printed circuit.

3. The support for a light source according to claim 1, wherein it comprises a second housing intended to accommodate said flexible printed circuit, said first housing and said second housing being arranged in relation to each other in such a way as to position said flexible printed circuit on said first printed circuit board, preferably close to one of said plurality of edges of said first printed circuit board.

4. The support for a light source according to claim 3, wherein said second housing presents an opening close to an opening of said first housing.

5. The support for a light source according to claim 1, wherein said means of positioning of said flexible printed circuit comprise means of guiding of said support, said plurality of edges at least partially surrounding the opening of intended to operate on said plurality of edges of said flexible printed circuit.

6. The support for a light source according to claim 1, wherein said first housing comprises said plurality of edges formed by a recess in the thickness said first housing.

7. The support for a light source according to claim 6, wherein said plurality of edges of said first housing and/or said second housing comprise means of maintaining said first printed circuit board on said support.

8. The support for a light source according to claim 7, wherein said means of maintenances are deformable excrescences used for a precise positioning of clipping such as resilient hooks.

9. The support for a light source according to claim 6, wherein said support further comprises a second housing intended to accommodate said flexible printed circuit and comprising said plurality of edges formed by said recess in the thickness of said support in the extension of said recess of said first housing.

10. The support for a light source according to claim 9, wherein said plurality of edges of said second housing present an outward opening for access of said flexible printed circuit to said support, said plurality of edges comprising a part in the corner on both sides of the opening, thus forming a retention of said flexible printed circuit towards the outside of said support.

11. A light source device comprising a support according to claim 1, wherein said light source fitted on said first printed circuit board, said first printed circuit board being housed in said support and said flexible printed circuit linked mechanically and electrically, to said support.

12. The light source device according to claim 11, wherein said flexible printed circuit is linked mechanically to said support by at least one pin of said support, cooperating by insertion with a corresponding opening of said flexible printed circuit, the end of said at least one pin being widened after insertion into the opening.

13. The light source device according claim 11, wherein said end of said flexible printed circuit on side of said support is superimposed on said first printed circuit and is linked electrically to said first printed circuit by laser welding or hot welding of 'Hot Bar' type.

14. The light source device according to claim 11, wherein said end of said flexible printed circuit on the side of said support is arranged alongside said first printed circuit and is linked electrically to said first printed circuit by wire welding.

15. The light source device according to claim 11, wherein said support comprises a connector at the end of said flexible printed circuit opposite said support.

16. The support for a light source according to claim 1, wherein said support is mounted in a lighting or signalling module.

17. The support for a light source according to claim 2, wherein it comprises a second housing intended to accommodate said flexible printed circuit, said first housing and said second housing being arranged in relation to each other in such a way as to position said flexible printed circuit on said first printed circuit board, preferably close to one of the edges of said first printed circuit board.

18. The support for a light source according to claim 2, wherein said means of positioning of said flexible printed circuit comprise means of guiding intended to operate on said plurality of edges of said flexible printed circuit.

19. The support for a light source according to claim 4, wherein said means of positioning of said flexible printed circuit comprise means of guiding intended to operate on said plurality of edges of said flexible printed circuit.

20. The support for a light source according to claim 2, wherein said first housing comprises said plurality of edges formed by a recess in the thickness of said support, said plurality of edges at least partially surrounding the opening of said first housing.

21. The support for a light source according to claim 3, wherein said first housing comprises said plurality of edges formed by a recess in the thickness of said support, said plurality of edges at least partially surrounding the opening of said first housing.

22. The support for a light source according to claim 2, wherein said support further comprises a second housing intended to accommodate said flexible printed circuit and comprising said plurality of edges formed by a recess in the thickness of said support in the extension of said recess of said first housing.

23. The light source device according claim 12, wherein said end of said flexible printed circuit on the side of said support is superimposed on said first printed circuit and is linked electrically to said first printed circuit by laser welding or hot welding of 'Hot Bar' type.

24. The light source device according to claim 12, wherein said end of said flexible printed circuit on side of said support is arranged alongside said first printed circuit and is linked electrically to said first printed circuit by wire welding.

25. The light source device according to claim 13, wherein said support comprises a connector at said end of said flexible printed circuit opposite said support.

26. The light source device according to claim 11 wherein said support is mounted in a lighting or signalling module.

\* \* \* \* \*